United States Patent
Noguchi et al.

(10) Patent No.: US 10,496,546 B2
(45) Date of Patent: Dec. 3, 2019

(54) CACHE MEMORY AND PROCESSOR SYSTEM

(71) Applicant: KABUSHIKI KAISHA TOSHIBA, Tokyo (JP)

(72) Inventors: Hiroki Noguchi, Kanagawa (JP); Tetsufumi Tanamoto, Kanagawa (JP); Kazutaka Ikegami, Kanagawa (JP); Shinobu Fujita, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 393 days.

(21) Appl. No.: 15/257,163

(22) Filed: Sep. 6, 2016

(65) Prior Publication Data

US 2016/0371189 A1 Dec. 22, 2016

Related U.S. Application Data

(63) Continuation of application No. PCT/JP2015/056824, filed on Mar. 9, 2015.

(30) Foreign Application Priority Data

Mar. 7, 2014 (JP) .................................. 2014-045438

(51) Int. Cl.
*G06F 12/0868* (2016.01)
*G06F 12/0811* (2016.01)
(Continued)

(52) U.S. Cl.
CPC ...... *G06F 12/0868* (2013.01); *G06F 11/1064* (2013.01); *G06F 12/0811* (2013.01);
(Continued)

(58) Field of Classification Search
CPC ............ G06F 12/0868; G06F 11/1064; G06F 12/0811; G06F 12/0895; G06F 2212/1024;
(Continued)

(56) References Cited

U.S. PATENT DOCUMENTS

| 4,525,800 A * | 6/1985 | Hamerla ................. G06F 12/08 365/228 |
| 2004/0095265 A1* | 5/2004 | Yoneyama ........... G09G 3/3685 341/100 |

(Continued)

FOREIGN PATENT DOCUMENTS

| JP | 2008-310876 | 12/2008 |
| JP | 2012-22726 | 2/2012 |

(Continued)

OTHER PUBLICATIONS

International Search Report dated May 19, 2015 from the Japanese Patent Office in International Application No. PCT/JP2015/056824. 1 page.

*Primary Examiner* — April Y Blair
*Assistant Examiner* — Dipakkumar B Gandhi
(74) *Attorney, Agent, or Firm* — Finnegan, Henderson, Farabow, Garrett & Dunner, L.L.P.

(57) ABSTRACT

A cache memory has a data cache to store data per cache line, a tag to store address information of the data to be stored in the data cache, a cache controller to determine whether an address by an access request of a processor meets the address information stored in the tag and to control access to the data cache and the tag, and a write period controller to control a period required for writing data in the data cache based on at least one of an occurrence frequency of read errors to data stored in the data cache and a degree of reduction in performance of the processor due to delay in reading the data stored in the data cache.

21 Claims, 8 Drawing Sheets

(51) Int. Cl.
  *G06F 12/0895* (2016.01)
  *G06F 11/10* (2006.01)
  *G11C 11/16* (2006.01)
  *G06F 12/0891* (2016.01)
  *G11C 29/04* (2006.01)

(52) U.S. Cl.
  CPC ...... *G06F 12/0895* (2013.01); *G11C 11/1659* (2013.01); *G11C 11/1675* (2013.01); *G06F 2212/1024* (2013.01); *G06F 2212/1028* (2013.01); *G06F 2212/502* (2013.01); *G06F 2212/608* (2013.01); *G11C 2029/0411* (2013.01); *G11C 2207/2245* (2013.01); *Y02D 10/13* (2018.01)

(58) Field of Classification Search
  CPC ....... G06F 2212/1028; G06F 2212/502; G06F 2212/608; G11C 11/1659; G11C 11/1675; G11C 2029/0411; G11C 2207/2245; Y02D 10/13

See application file for complete search history.

(56) References Cited

U.S. PATENT DOCUMENTS

| | | | |
|---|---|---|---|
| 2004/0114483 A1* | 6/2004 | Kaneko | G11B 20/00086 369/53.21 |
| 2005/0174860 A1* | 8/2005 | Kim | G11C 7/1072 365/196 |
| 2006/0271723 A1* | 11/2006 | Visalli | G06F 12/0895 711/3 |
| 2008/0310215 A1 | 12/2008 | Ueda | |
| 2011/0078538 A1 | 3/2011 | Ikegawa et al. | |
| 2011/0280065 A1 | 11/2011 | Rao et al. | |
| 2013/0080687 A1* | 3/2013 | Nemazie | G06F 12/0246 711/103 |
| 2013/0191595 A1* | 7/2013 | Cheng | G06F 12/0802 711/118 |
| 2014/0157065 A1 | 6/2014 | Ong | |
| 2015/0039836 A1* | 2/2015 | Wang | G06F 12/0804 711/136 |
| 2015/0063020 A1 | 3/2015 | Kajigaya | |

FOREIGN PATENT DOCUMENTS

| | | |
|---|---|---|
| JP | 2013-529350 | 7/2013 |
| JP | 2014-110073 | 6/2014 |
| JP | 2015-49918 | 3/2015 |

\* cited by examiner

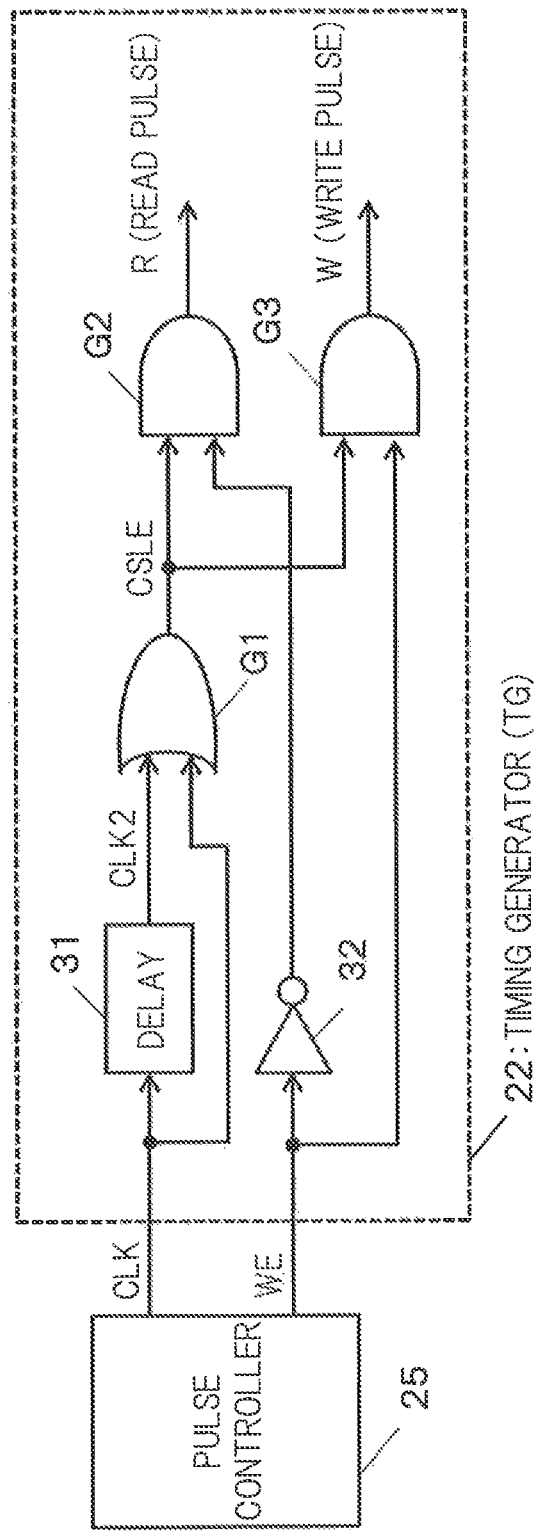
F I G. 5

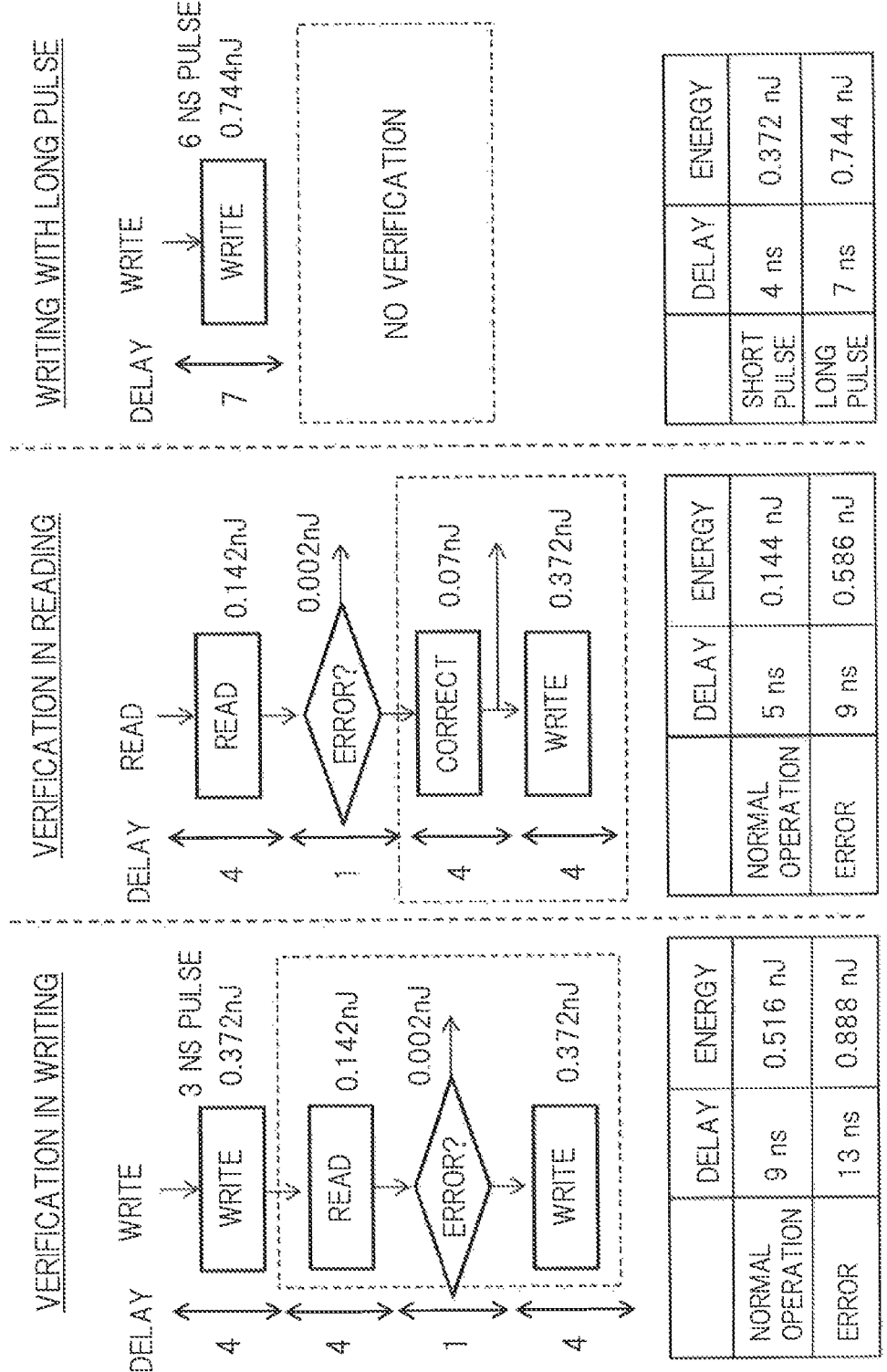

CACHE MEMORY AND PROCESSOR SYSTEM

CROSS REFERENCE TO RELATED APPLICATIONS

This application is based upon and claims the benefit of priority from the prior Japanese Patent Application No. 2014-45438, filed on Mar. 7, 2014, the entire contents of which are incorporated herein by reference.

FIELD

Embodiments relate to a cache memory.

BACKGROUND

There is a tendency for cache memories to have a larger capacity, along with which there is a problem of increase in leakage current of the cache memories. MRAMs (Magnetoresistive RAMS) attract attention as a candidate for a large-capacity cache memory are non-volatile. MRAMs have a feature of much smaller leakage current than SRAMs currently used in the cache memories.

Spin injection magnetization inversion is one of MRAM data writing techniques. In the spin injection magnetization inversion, a write current having a specific current value or larger flows into a magnetic tunnel junction element (MTJ element) of an MRAM. Also in data reading, a specific read current flows into the MTJ element.

The current value of a write current for spin injection MRAMs is set to be equal or larger than an inversion threshold value at which spin injection causes magnetization inversion. The current value of a read current for the spin injection MRAMs is set to be smaller than the inversion threshold value.

However, due to characteristic variation in a plurality of MTJ elements of an MRAM, the inversion threshold value varies for each MTJ element. Moreover, when data is repeatedly written in the same MTJ element, the inversion threshold value for the MTJ element becomes unstable.

The above-described drawbacks may cause several problems such as write errors in data writing, read disturb originated in a read current in data reading, magnetization inversion due to thermal agitation in data retention, and retention failure.

One proposal to deal with these failures is an MRAM provided with an ECC (Error Correction and Coding) circuitry for error correction in data reading. Another proposed technique is to rewrite data with a long write pulse width when an error is detected. However, the write pulse width is adjusted to be longer for rewriting after an error is detected, which causes a longer average latency in accessing an MRAM.

BRIEF DESCRIPTION OF DRAWINGS

FIG. 5 is a circuit diagram showing an example of the internal configuration of a timing generator 22 of FIG. 4;

FIGS. 8A to 8C are diagrams illustrating the comparison of power consumption between the case where the pulse width of a write pulse signal W is controlled and the case where it is not controlled.

DETAILED DESCRIPTION

The present embodiment provides a cache memory has a data cache to store data per cache line, a tag to store address information of the data to be stored in the data cache, a cache controller to determine whether an address by an access request of a processor meets the address information stored in the tag and to control access to the data cache and the tag, and a write period controller to control a period required for writing data in the data cache based on at least one of an occurrence frequency of read errors to data stored in the data cache and a degree of reduction in performance of the processor due to delay in reading the data stored in the data cache.

Hereinafter, embodiments will be explained with reference to the drawings. The following embodiments will be explained mainly with unique configurations and operations of a cache memory and a processor system. However, the cache memory and the processor system may have other configurations and operations which will not be described below. These omitted configurations and operations are also included in the scope of the embodiments.

Figure 1:
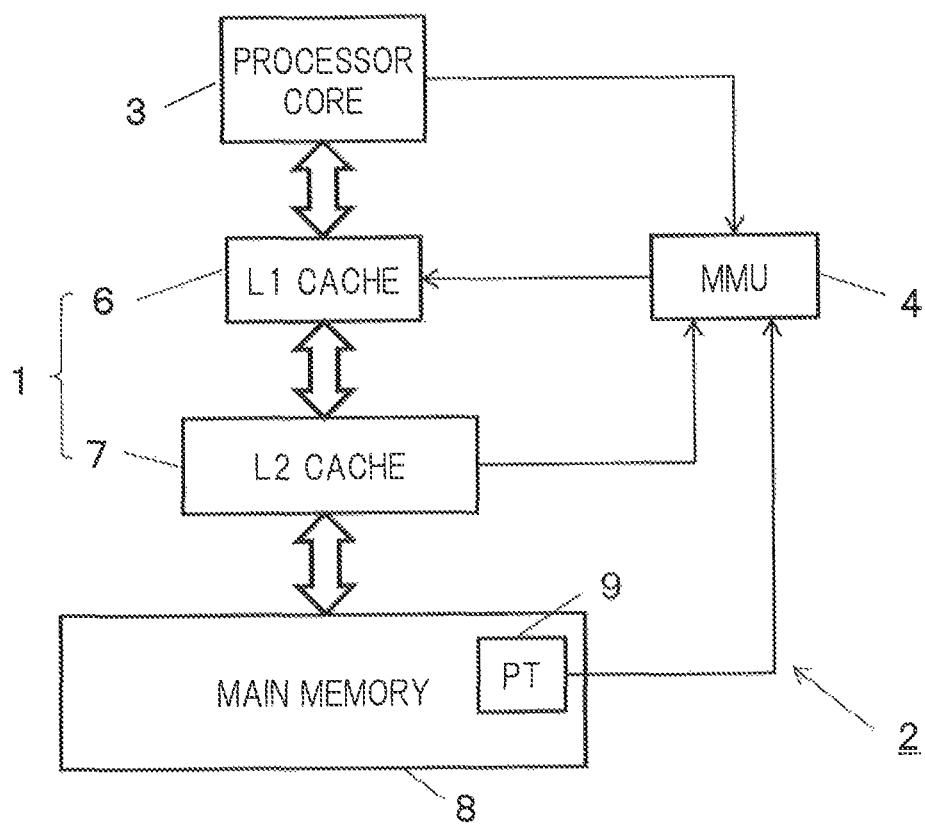
FIG. 1 is a block diagram schematically showing the configuration of a processor system 2 having a built-in cache memory 1 according to an embodiment.

FIG. 1 is a block diagram schematically showing the configuration of a processor system 2 having a built-in cache memory 1 according to an embodiment. The processor system 2 of FIG. 1 is provided with the cache memory 1, a processor core 3, an MMU 4, and a power monitoring circuitry 17. The cache memory 1 has a layered structure of, for example, an L1-cache 6 and an L2-cache 7.

The MMU 4 converts a virtual address issued by the processor core 3 into a physical address to access a main memory 8 and the cache memory 1. Based on a history of memory addresses accessed by the processor core 3, the MMU 4 looks up to a page table (PT) 9 stored in the main memory 8 to acquire a page table entry corresponding to an address currently accessed to update a conversion table of virtual addresses and physical addresses. The page table 9 is usually managed by an OS. However, a mechanism for managing the page table may be provided in the cache memory 1.

When the operation of the processor core 3 is halting for a certain period and when there is no operation request from outside, the power monitoring circuitry 17 supplies a power control signal to the processor system 2. The power control signal lowers a power supply voltage of or halts power supply to at least a part of circuit blocks in the processor system 2.

The cache memory 1 of FIG. 1 stores at least a part of data stored in or of data to be stored in the main memory 8. The cache memory 1 includes a cache memory of a level L2 or higher.

Figure 2:
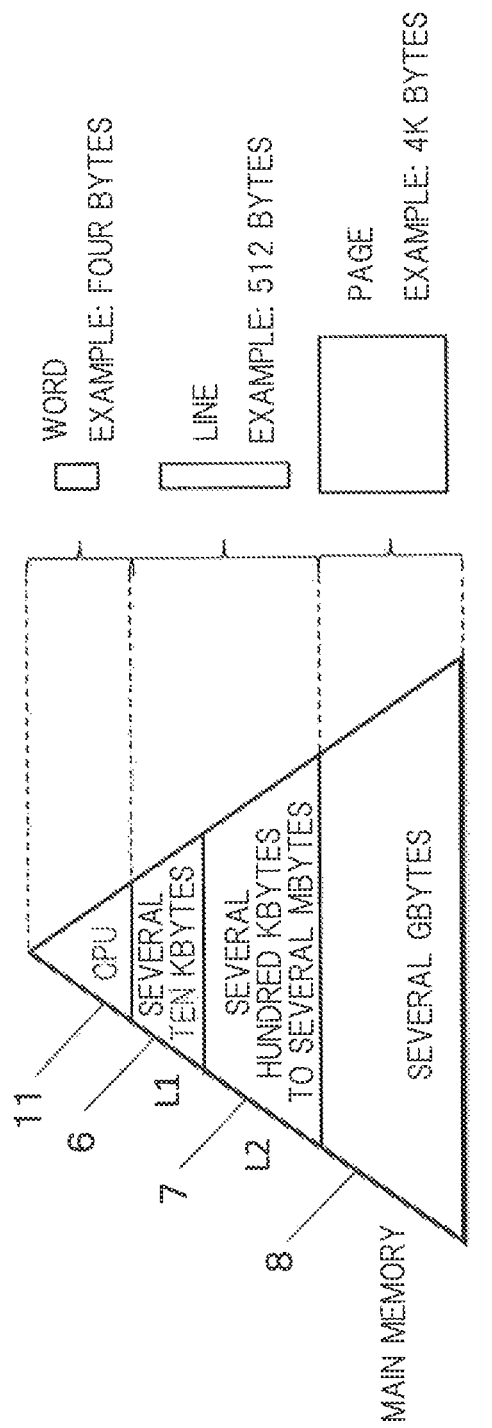
FIG. 2 is a diagram showing a memory layered structure in the present embodiment.

FIG. 2 is a diagram showing a memory layered structure in the present embodiment. As shown, the L1-cache 6 is positioned on the upper-most layer, followed by the L2-cache 7 on the next layer and the main memory 8 on the lower-most layer. When the processor core (CPU) 3 issues an address, the L1-cache 6 is accessed at first. When there is no hit in the L1-cache 6, the L2-cache 7 is accessed next. When there is no hit in the L2-cache 7, the main memory 8 is accessed. Although, as described above, a higher-level cache memory of an L3-cache or more may be provided, an example explained in the present embodiment is the cache memory 1 of the L1-cache 6 and the L2-cache 7 of two layers.

The L1-cache 6 has a memory capacity of, for example, several ten kbytes. The L2-cache 7 has a memory capacity of, for example, several hundred kbytes to several Mbytes. The main memory 8 has a memory capacity of, for example, several Gbytes. The processor core 3 usually accesses the L1-cache 6 and the L2-cache 7 per cache line, and the main memory 8 per page. Each cache line has, for example, 512 bytes and one page has, for example, 4 kbytes. The number of bytes for the cache lines and the pages is set arbitrarily.

Data that is stored in the L1-cache 6 is also usually stored in the L2-cache 7. Data that is stored in the L2-cache 7 is also usually stored in the main memory 8.

Figure 3:
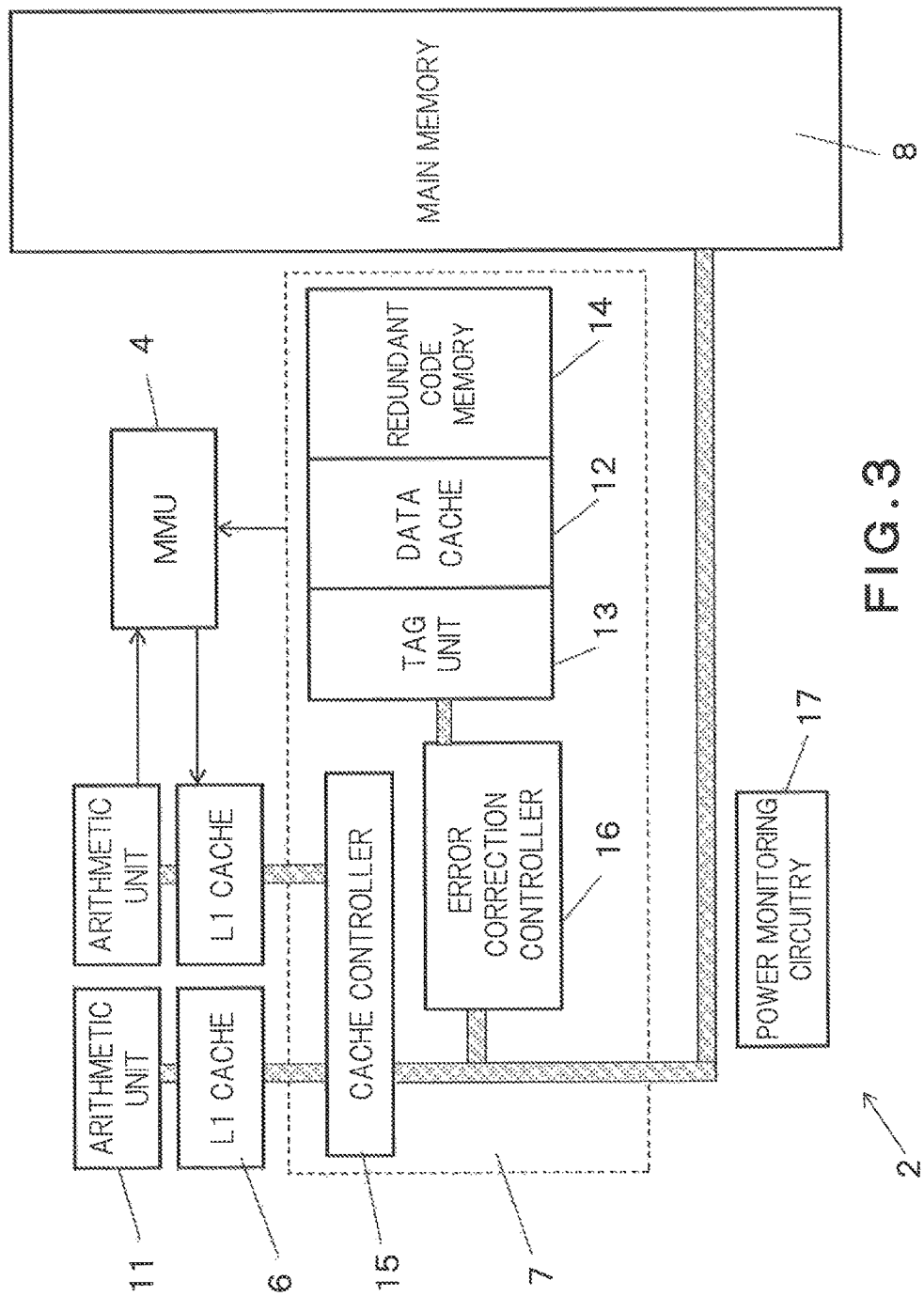
FIG. 3 is a block diagram of a detailed internal configuration of the cache memory 1 of FIG. 1.

FIG. 3 is a block diagram of a detailed internal configuration of the cache memory 1 of FIG. 1. The processor core 3 has, for example, a multicore configuration with a plurality of arithmetic units 11. The L1-cache 5 is connected to each arithmetic unit 11. Since the L1-cache 6 is required to have a high-speed performance, it has an SRAM (Static Random Access Memory), for example. The processor core 3 may have a single-core configuration with one L1-cache 6.

The L2-cache 7 of FIG. 3 has a data cache 12, a tag unit 13, a redundant code memory 14, a cache controller 15, and an error correction controller 16.

The data cache 12 stores cache line data that are accessible per cache line. The tag unit 13 stores address information of the cache line data.

The redundant code memory 14 stores a redundant code for correcting an error of each cache line data stored in the data cache 12. The redundant code memory 14 may also store redundant codes for the address information stored in the tag unit 13.

The data cache 12 has non-volatile memories, for example. A non-volatile memory usable for the data cache 12 is, for example, an MRAM (Magnetoresistive RAM) which is easy to be configured to have a larger capacity.

The tag unit 13 has volatile memories, for example. A volatile memory usable for the tag unit 13 is, for example, an SRAM (Static RAM) with a higher-speed performance than the MRAM.

The cache controller 15 determines whether data corresponding to an address issued by the processor core 3 is stored in the data cache 12. In detail, the cache controller 15 performs a hit/miss determination on whether the address issued by the processor core 3 matches the address information stored in the tag unit 13, to control data write and read to and from the L-2 cache 7 and write-back to the main memory 8.

When storing new cache line data in the L-2 cache 7, the error correction controller 16 generates a redundant code for correcting an error of the cache line data and stores the redundant code in the redundant code memory 14. When reading cache line data from the data cache 12, for which there is a read request from the processor core 3, the error correction controller 16 reads a redundant code corresponding to the data from the redundant code memory 14 to perform an error correction process. Then, the error correction controller 16 transfers the error-corrected cache line data to the processor core 3.

Figure 4:
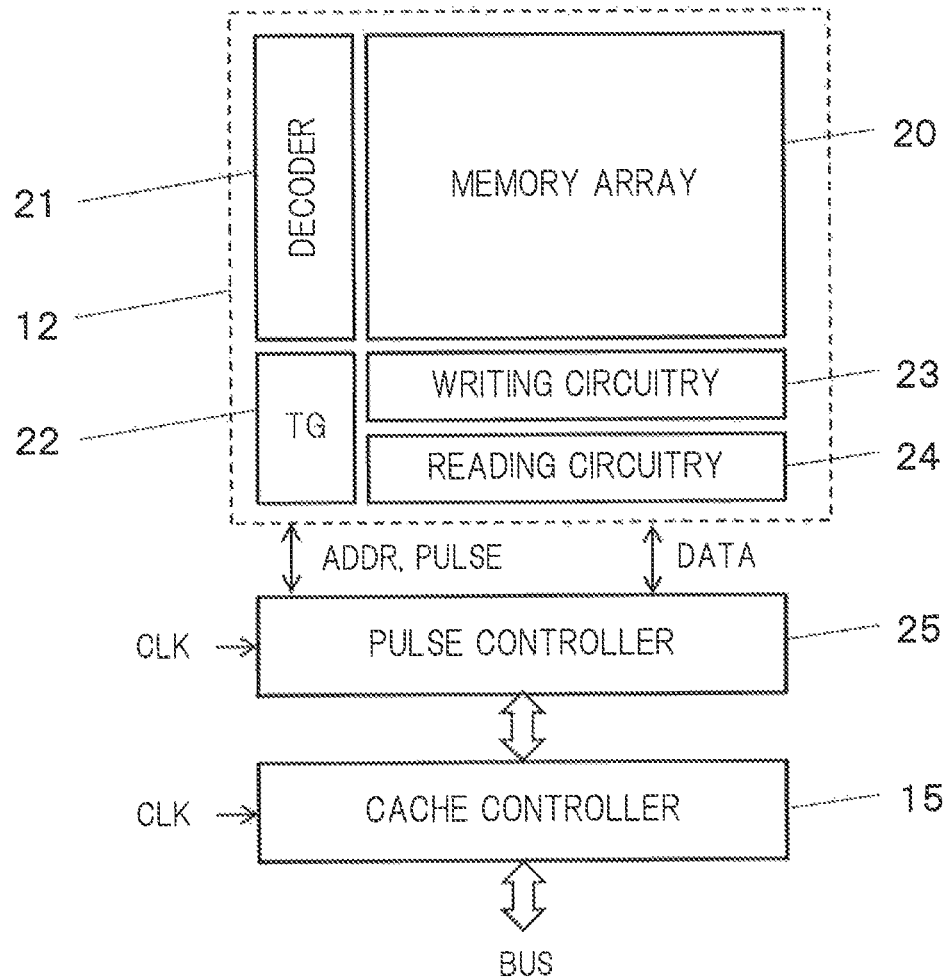
FIG. 4 is a block diagram showing a detailed configuration of the peripheral circuitry of a data cache 12 and a cache controller 15.

FIG. 4 is a block diagram showing a detailed configuration of the peripheral circuitry of the data cache 12 and the cache controller 15. As shown in FIG. 4, the data cache 12 is provided with a memory array 20, a decoder 21, a timing generator (TG) 22, a writing circuitry 23, and a reading circuitry 24. In addition, a pulse controller (write term controller) 25 is provided between the data cache 12 and the cache controller 15.

The memory array 20 has a plurality of vertically-and-horizontally arranged MRAM cells. To the gates of MRAM cells aligned in the row direction, the corresponding word lines (not shown) are connected, respectively. To the drains and sources of MRAM cells aligned in the column direction, the corresponding bit and source lines (not shown) are connected, respectively.

The timing generator 22 controls the timing of each block of the data cache 12. The decoder 21 drives a word line in synchronism with a signal from the timing generator 22, based on a result of decoding an address to which there is an access request from the processor core 3.

The writing circuitry 23 writes data in the memory array 20 in synchronism with a write pulse signal from the timing generator 22. The reading circuitry 24 reads data from the memory array 20 in synchronism with a read pulse signal from the timing generator 22.

The cache controller 15 controls access to the tag unit 13 and the data cache 12. The pulse controller 25 generates a clock signal CLK having a cycle that varies depending on at least either the occurrence frequency of read errors to data stored in the data cache 12 or the degree of reduction in performance of the processor core 3 due to delay in reading data stored in the data cache 12. The pulse controller 25 also generates a write enable signal WE having a pulse width corresponding to one cycle of the dock signal CLK. The timing generator 22 generates a write pulse signal W in synchronism with the write enable signal WE. The pulse width (write effective term) of the write pulse signal W varies depending on the pulse width of the write enable signal WE.

Therefore, the pulse width of the write enable signal WE varies depending on at least either the occurrence frequency of read errors to data stored in the data cache 12 or the degree of reduction in performance of the processor core 3 due to delay in reading data stored in the data cache 12. The occurrence frequency of data read errors indicates how often errors are detected by the error correction controller 16 in data reading. The degree of reduction in performance of the processor core 3 due to delay in data reading indicates, in more specifically, how much the delay in data reading affects the operation of the processor core 3. As one example, is that it is determined that the performance of the processor core 3 is reduced to a higher degree as data is accessed at a higher frequency. It is also determined that the performance of the processor core 3 is reduced to a higher degree in read access of data that the processor core 3 cannot perform the succeeding process without the data, i.e. critical data, even if the data is accessed at a low frequency.

The timing generator 22 generates a write pulse signal W having a pulse width in accordance with a pulse width of the write enable signal WE. In more detail, the write pulse signal W has a pulse width corresponding to a period in which the write enable signal WE and a signal CSLE which will be explained later are both at a high level. Therefore, the longer the pulse width of the write pulse signal W, the longer it takes to write data in the data cache 12. This means that, the longer the pulse width of the write pulse signal W, the more reliably data can be written in the data cache 12, which lowers error occurrence frequency. Moreover, the timing generator 22 generates a read pulse signal R that indicates a period in which the reading circuitry 24 performs a read operation, and also generates other control signals.

As described later, the tag unit 13 can store information that indicates the occurrence frequency of data read errors and information that indicates the access frequency. Therefore, based on the information stored in the tag unit 13, the pulse controller 25 can generate the dock signal CLK and the write enable signal WE.

The pulse controller 25 has, for example, a built-in frequency divider that can change a frequency division ratio in two or more ways. The frequency divider changes the frequency division ratio based on the information stored in the tag unit 13 described above. With the frequency divider, the pulse controller 25 can generate a variable-cycle clock signal CLK and a write enable signal WE having a pulse width corresponding to one cycle of the dock signal CLK.

Figure 6:
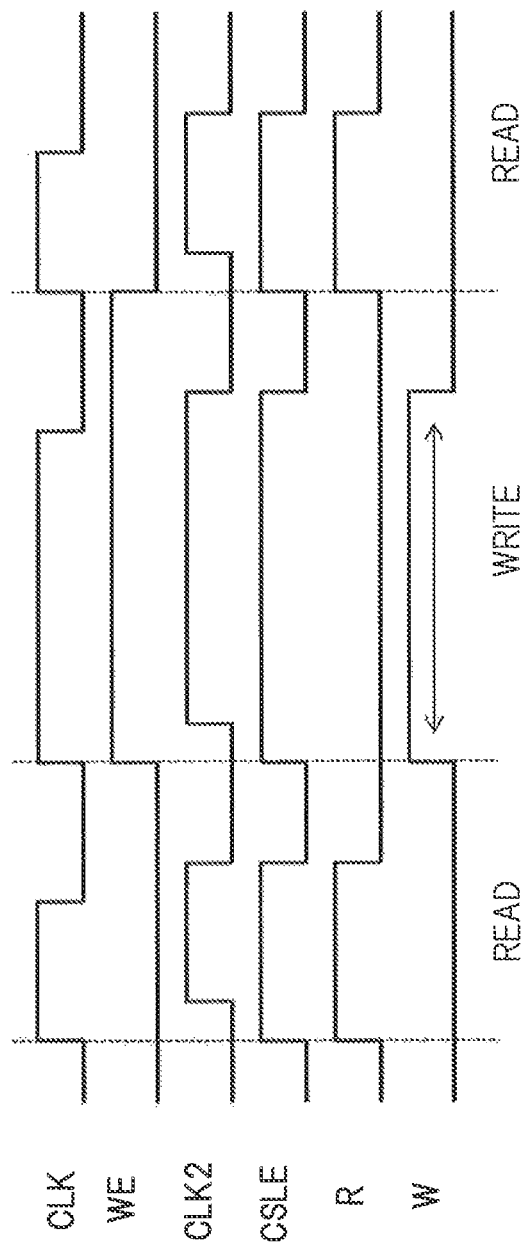
FIG. 6 is a timing chart of the timing generator 22.

FIG. 5 is a circuit diagram showing an example of the internal configuration of the timing generator 22 of FIG. 4. FIG. 6 is a timing chart of the timing generator 22. The clock signal CLK and the write enable signal WE output from the pulse controller 25 are input to the timing generator 22 of FIG. 5.

The timing generator 22 of FIG. 5 has a delay circuitry 31, an OR gate G1, two AND gates G2 and G3, and one inverter 32. The delay circuitry 31 delays the clock signal CLK by a predetermined period to generate a clock signal CLK2. The OR gate G1 takes a logical sum of the clock signal CLK and the delayed clock signal CLK2 to generate a logical sum signal CSLE. The AND gate G2 takes a logical conjunction of the signal CSLE and an inverted signal of the write enable signal WE to generate a read pulse signal R. The AND gate G3 takes a logical conjunction of the signal CSLE and the write enable signal WE to generate a write pulse signal W. The reason why, not the clock signal CLK, but the signal CSLE is used for generating the write pulse signal W is that the clock signal CLK is used in several circuits. The clock signal CLK is delayed to generate the signal CSLE having a long pulse width for generating the write pulse signal W.

The reading circuitry 24 reads data from the data cache 12 during a period in which the read pulse signal R is high. The writing circuitry 23 writes data in the data cache 12 during a period in which the write pulse signal W is high. As shown in FIG. 6, the pulse width of the write pulse signal W varies depending on the pulse width of the signal CSLE generated by the OR gate G1. As the pulse width of the signal CSLE is longer, the pulse width of the write pulse signal W becomes longer. And, as the pulse width of the write pulse signal W is longer, although it takes more time to write data, writing can be performed at higher reliability. Conversely, as the pulse width of the write pulse signal W is shorter, although data can be written at a higher speed, writing reliability is lowered, thereby heightening a possibility to rewrite data in verification.

The internal configuration of the timing generator 22 is not limited to that shown in FIG. 5. Moreover, the waveforms of the clock signal CLK, the write enable signal WE, the read pulse signal R, and the write pulse signal W are not limited to those shown in FIG. 6.

Figure 7:
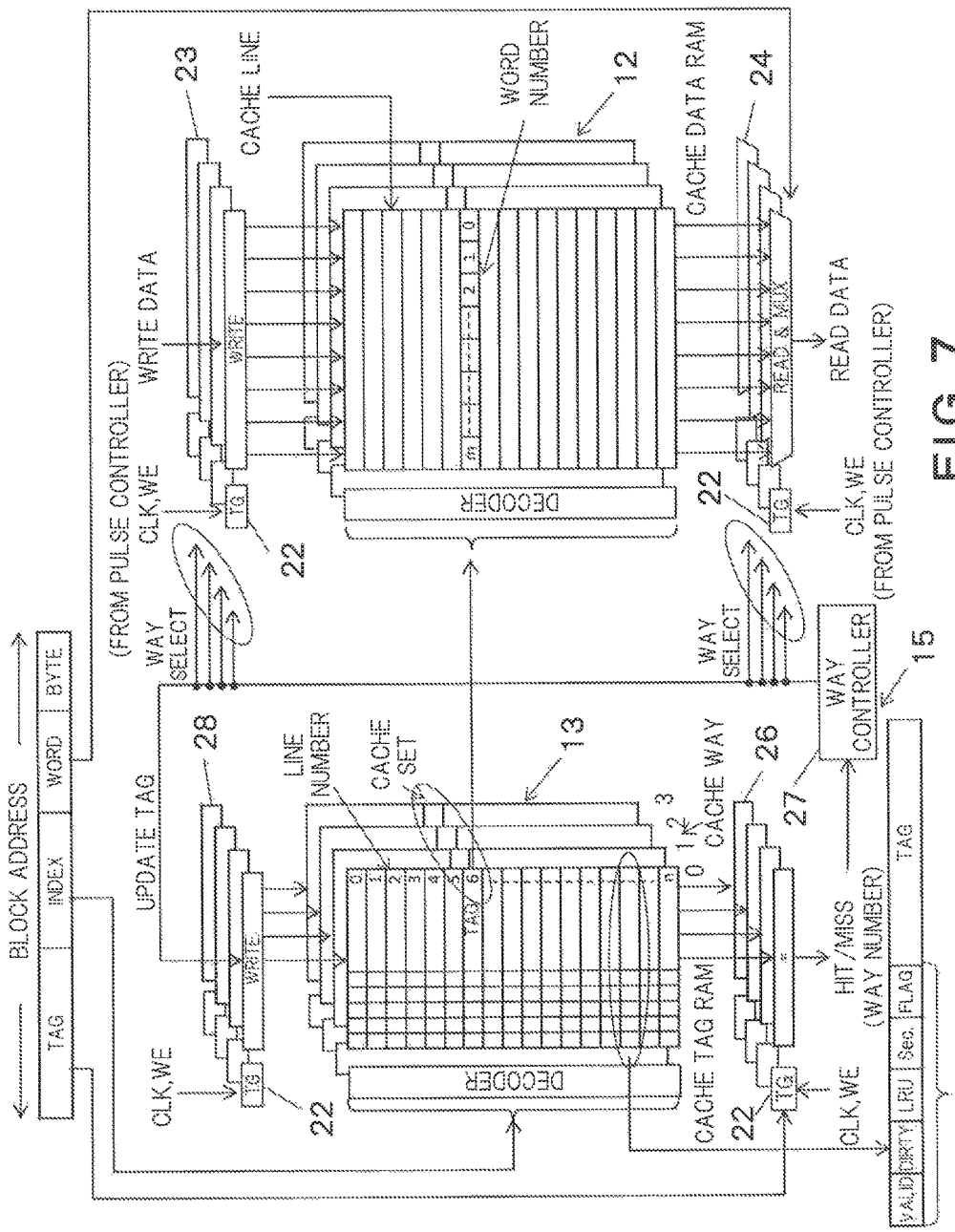
FIG. 7 is a block diagram showing an example of the internal configurations of a data cache 12 and a tag unit 13.

FIG. 7 is a block diagram showing an example of the internal configurations of the data cache 12 and the tag unit 13. As shown in FIG. 7, the data cache 12 and the tag unit 13 both store data and address information per cache line. The tag unit 13 is provided with a supplemental information storage unit 18 for storing supplemental information per cache line, in addition to the address information. The supplemental information includes validity flag information, dirty flag information, LRU (Least Recently Used) position information, security information, and additional flag information. The validity flag information has information that indicates whether the corresponding cache line is valid or invalid. The dirty flag information has information that indicates whether to need to write back to a lower-layer cache memory or the main memory 8. The LRU position information has information that indicates whether data is accessed at a low frequency. The security information has information on the characteristics of the data cache 12, such as read-only, read-write, and write-only. The additional flag information, which is newly added flag information in the present embodiment, has information that indicates whether the performance of the processor core 3 is lowered due to data read delay.

The data cache 12 and the tag unit 13 of FIG. 7 are both divided into a plurality of ways. Each way has a plurality of cache lines. Each way in the tag unit 13 has address information and the above-described supplemental information. Likewise, the writing circuitry 23 and the reading circuitry 24 are both divided into a plurality of ways. FIG. 7 shows four ways, as an example. There is no particular limitation to the number of ways. It is free to decide whether to divide each of the data cache 12 and the tag unit 13 into a plurality of ways.

As shown in FIG. 7, the cache controller 15 is provided with a built-in hit/miss determination circuitry 26, a way controller 27, and a tag write controller 28. The hit/miss determination circuitry 26 determines whether an address for which there is an access request from the processor core 3 matches address information stored in the tag unit 13. The way controller 27 generates a way selection signal that indicates which way an access is made to, based on a determination signal from the hit/miss determination circuitry 26. Moreover, when there is a miss, the way controller 27 performs the replacement of cache line data that is accessed at low frequency, based on the LRU position information. The tag write controller 28 performs data writing to a cache line of a specific way when there is an instruction to rewrite the cache line.

A virtual address issued by the processor core 3 is converted into a physical address by the MMU 4. As shown in FIG. 7, the physical address has a tag address, an index address, a word address, and a byte address arranged in order from the most- to least-significant bits. With the index address, a specific cache line of the tag unit 13 is selected. Address information stored in the specific cache line and a tag address for which there is an access request from the processor core 3 are sent to the hit/miss determination circuitry 26 for hit/miss determination. If it is determined that there is a hit, the data of the data cache 12, which corresponds to the specific cache line, is read and sent to the processor core 3. If it is determined that there is a miss, an access is made to a lower-layer cache memory or the main memory 8 or data replacement is performed to cache line data corresponding to an LRU position.

FIGS. 8A to 8C are diagrams illustrating the comparison of power consumption between the case where the puke width of the write pulse signal W is controlled and the case where it is not controlled. FIGS. 8A to 8C show results of simulation of 1-bit error correction and 2-bit error detection by an error correction controller for an MRAM with 512-bit cache lines fabricated by a 65-nm process.

FIGS. 8A and 8B show verification in data writing and data reading, respectively. In FIGS. 8A and 8B, the write pulse width is constant. In detail, FIGS. 8A and 8B show a comparative example of writing with a write pulse signal W having a short write pulse width. FIG. 8C corresponds to the present embodiment, which is an example of no verification in the case where writing is performed with a write pulse signal W having a long pulse width.

In the case of FIG. 8A, a write operation takes 4 nS with 0.372 nJ consumed in power. In verification, a read operation takes 4 nS with 0.142 nJ consumed in power, with 1 nS for error determination having 0.002 nJ consumed in power. A rewrite operation due to errors takes 4 nS with 0.372 nJ consumed in power. As a result, the total processing time with no errors is 9 nS with 0.516 nJ in power consumption. The total processing time with errors is 13 nS with 0.888 nJ in power consumption.

In the case of FIG. 8B, a read operation takes 4 nS with 0.142 nJ consumed in power. In verification, error determination takes 1 ns with 0.002 nJ consumed in power. Deletion due to errors takes 4 nS with 0.07 nJ consumed in power, followed by rewriting for 4 nS with 0.372 nJ consumed in power. As a result, the total processing time with no errors is 5 nS with 0.144 in power consumption. The total processing time with errors is 9 nS with 0.586 nJ in power consumption.

In the case of FIG. 8C, writing with a write pulse signal W having a short pulse width takes 4 ns with 0.372 nJ consumed in power. Writing with a write pulse signal W having a long pulse width takes 7 ns with 0.744 nJ consumed in power.

As understood from the results of FIGS. 8A to 8C, as the pulse width of the write pulse signal W is longer, writing takes more time and thus power consumption increases, nevertheless, the reliability of writing improves and thus the frequency of rewriting reduces. Data writing with a write pulse signal W having a short pulse width followed by rewriting as a result of the data writing consumes larger power and takes more time than data writing with a write pulse signal W having a long pulse width from the beginning. Therefore, when there is a large effect of high occurrence frequency of read errors, delay in reading, etc., by adjusting the pulse width of the write pulse signal W to be longer in advance, it is possible to reduce power consumption and quickly write data.

It is also found in this simulation that, by doubling the pulse width of the write pulse signal W, the probability of occurrence of write errors can be reduced to about $1/100$.

As described above, in the present embodiment, the pulse width of the write pulse signal W is controlled based on at least either the occurrence frequency of read errors to data stored in the data cache 12 or the degree of reduction in performance of the processor core 3 due to delay in reading data stored in the data cache 12. With this control, it is possible to reduce the frequency of error detection and error correction by the error correction controller 16, improve the average latency of the processor core 3, and restrict the power consumption.

Although several embodiments of the present invention have been explained above, these embodiments are examples and not to limit the scope of the invention. These new embodiments can be carried out in various forms, with various omissions, replacements and modifications, without departing from the conceptual idea and gist of the present invention. The embodiments and their modifications are included in the scope and gist of the present invention and also in the inventions defined in the accompanying claims and their equivalents.

The invention claimed is:
1. A cache memory comprising:
a data cache comprising a non-volatile memory to store data per cache line;
a tag to store address information of the data to be stored in the data cache;
a cache controller to determine whether an address by an access request of a processor meets the address information stored in the tag and to control access to the data cache and the tag; and
a write period controller to control a period required for writing data in the data cache based on of an occurrence frequency of read errors to data stored in the data cache.
2. The cache memory of claim 1, wherein the write period controller generates a write pulse signal having a pulse width corresponding to the period required for writing data in the data cache based on an occurrence frequency of read errors to data stored in the data cache.
3. The cache memory of claim 2, wherein the write period controller controls the pulse width of the write pulse signal, per cache line, based on an access frequency to the data cache per cache line.
4. The cache memory of claim 3, wherein the write period controller controls the pulse width of the write pulse signal to be longer for cache lines to be accessed at a higher frequency than for cache lines to be accessed at a lower frequency.
5. The cache memory of claim 2, wherein the write period controller controls the pulse width of the write pulse signal, per cache line, based on an occurrence frequency of read errors to data stored in the data cache per cache line.
6. The cache memory of claim 5, wherein the write period controller controls the pulse width of the write pulse signal to be longer for cache lines to which read errors occur at a higher frequency than for cache lines to which read errors occur at a lower frequency.
7. The cache memory of claim 1 further comprising an error correction controller, when data stored in the data cache is read, to perform error detection and error correction to the data using a redundant bit that corresponds to the data,
wherein, based on a result of the error detection by the error correction controller, the write period controller determines an occurrence frequency of read errors to the data, per cache line.
8. The cache memory of claim 1, wherein the tag comprises a supplemental information storage to store, per cache line, at least one of information indicating an access frequency to a corresponding cache line of the data cache and information indicating an occurrence frequency of read errors.
9. The cache memory of claim 8, wherein the write period controller controls a pulse width of a write pulse signal based on at least one of the information indicating an access frequency and the information indicating an occurrence frequency of read errors, the information being stored in the supplemental information storage.
10. The cache memory of claim 8, wherein the data cache and the tag are both divided into a plurality of ways, the ways being accessible per cache line,
wherein the tag comprises the supplemental information storage for the cache line of the respective ways.
11. The cache memory of claim 1, wherein the data cache comprises an MRAM (Magnetoresistive RAM).
12. A processor system comprising: a processor; and a cache memory, wherein the cache memory comprises: a data cache comprising a non-volatile memory to store data per cache line; a tag to store address information of the data to be stored in the data cache; a cache controller to determine whether an address by an access request of the processor meets the address information stored in the tag and to control access to the data cache and the tag; and a write period controller to control a period required for writing data in the data cache based on an occurrence frequency of read errors to data stored in the data cache.

13. The processor system of claim 12, wherein the write period controller generates a write pulse signal having a pulse width corresponding to the period required for writing data in the data cache based on an occurrence frequency of read errors to data stored in the data cache.

14. The processor system of claim 13, wherein the write period controller controls the pulse width of the write pulse signal, per cache line, based on an access frequency to the data cache per cache line.

15. A cache memory comprising:
a data cache comprising a non-volatile memory to store data per cache line;
a tag to store address information of the data to be stored in the data cache;
a cache controller to determine whether an address by an access request of a processor meets the address information stored in the tag and to control access to the data cache and the tag; and
a write period controller to control a period required for writing data in the data cache based on a degree of reduction in performance of the processor due to delay in reading the data stored in the data cache.

16. The cache memory of claim 15, wherein the degree of reduction in performance of the processor due to delay in reading the data stored in the data cache is determined based on an access frequency to the data cache per cache line.

17. The cache memory of claim 15, wherein the degree of reduction in performance of the processor due to delay in reading the data stored in the data cache is determined based on whether the data to be stored in the data cache per cache line is critical data.

18. The cache memory of claim 15, wherein the write period controller generates a write pulse signal having a pulse width corresponding to the period required for writing data in the data cache based on a degree of reduction in performance of the processor due to delay in reading the data stored in the data cache.

19. The cache memory of claim 18, wherein the write period controller controls the pulse width of the write pulse signal, per cache line, based on an access frequency to the data cache per cache line.

20. The cache memory of claim 19, wherein the write period controller controls the pulse width of the write pulse signal to be longer for cache lines to be accessed at a higher frequency than for cache lines to be accessed at a lower frequency.

21. The cache memory of claim 15, wherein the data cache comprises an MRAM (Magnetoresistive RAM).

* * * * *